United States Patent
Dong (10) Patent No.: US 9,754,384 B2
(45) Date of Patent: Sep. 5, 2017

(54) RELEVANT METHOD AND DEVICE FOR COMPRESSION, DECOMPRESSION AND PROGRESSIVE TRANSMISSION OF SPATIAL DATA

(71) Applicant: SUZHOU SUPERENGINE GRAPHICS SOFTWARE TECHNOLOGY DEVELOPMENT CO., LTD., Suzhou, Jiangsu (CN)

(72) Inventor: Futian Dong, Jiangsu (CN)

(73) Assignee: SUZHOU SUPERENGINE GRAPHICS SOFTWARE TECHNOLOGY DEVELOPMENT CO., LTD., Jiangsu (CN)

( * ) Notice: Subject to any disclaimer, the term of this patent is extended or adjusted under 35 U.S.C. 154(b) by 134 days.

(21) Appl. No.: 14/394,610

(22) PCT Filed: Apr. 18, 2013

(86) PCT No.: PCT/CN2013/074364
§ 371 (c)(1),
(2) Date: Oct. 15, 2014

(87) PCT Pub. No.: WO2013/155974
PCT Pub. Date: Oct. 24, 2013

(65) Prior Publication Data
US 2015/0091929 A1    Apr. 2, 2015

(30) Foreign Application Priority Data
Apr. 18, 2012    (CN) .......................... 2012 1 0114177

(51) Int. Cl.
*G06T 9/00* (2006.01)
*H03M 7/30* (2006.01)

(52) U.S. Cl.
CPC ................ *G06T 9/00* (2013.01); *G06T 9/005* (2013.01); *H03M 7/30* (2013.01)

(58) Field of Classification Search
CPC   G06T 1/00; G06T 15/00; G06T 17/05; G06T 19/00; G06T 9/00; H03M 7/3059
(Continued)

(56) References Cited

U.S. PATENT DOCUMENTS 5,745,392 A * 4/1998 Ergas ...................... G06T 9/005
                                                                      702/14
6,577,769 B1 * 6/2003 Kenyon .................. G06T 9/001
                                                                      358/1.15
(Continued)

FOREIGN PATENT DOCUMENTS

CN        1738247 A       2/2006
CN      101827097 A       9/2010
(Continued)

OTHER PUBLICATIONS

"Grids, Scale, and Proportion", ASU, archived by Google on Feb. 1, 2001, accessible at https://www.asu.edu/cfa/wwwcourses/art/SOACore/scalemain.htm.*

(Continued)

*Primary Examiner* — Barry Drennan
*Assistant Examiner* — Phong Nguyen
(74) *Attorney, Agent, or Firm* — Cantor Colburn LLP (57) ABSTRACT

Disclosed are a method for compression, decompression and progressive transmission of spatial data and a device thereof. A compression method for spatial data comprises: according to a preset view control parameter, acquiring a compression parameter Z; according to the view control parameter, determining a reference point P; according to the compression parameter Z, converting the coordinate values of the coordinate points of the spatial data and the coordinate value of
(Continued)

the reference point P into integers; and using the differences of the values resulting from conversion of the coordinate values of the coordinate points of the spatial data into the integers and the values resulting from conversion of the coordinate values of the reference point P into integers as compressed data. Also disclosed are a method for determining the maximum data bit for storing spatial data, a method for inserting incremental data, a method for compressing and decompressing incremental data and a device thereof. The present invention can solve the problems of a method for compression and progressive transmission of spatial data, such as large calculation amount, low efficiency, and incapability of guaranteeing correct display of spatial correlation among all the compressed spatial data.

19 Claims, 3 Drawing Sheets (58) Field of Classification Search
USPC ........ 345/555, 660, 668, 669; 382/166, 232; 715/781–807
See application file for complete search history.

(56) References Cited

U.S. PATENT DOCUMENTS

| | | | | |
|---|---|---|---|---|
| 6,703,947 | B1* | 3/2004 | Wallner | H03M 7/30 341/50 |
| 7,324,115 | B2* | 1/2008 | Fraser | G06T 15/00 345/419 |
| 7,725,529 | B2* | 5/2010 | Yang | G06F 17/30241 709/203 |
| 2001/0055032 | A1* | 12/2001 | Saito | G06K 9/48 345/660 |
| 2004/0119611 | A1* | 6/2004 | Oh | G08G 1/0962 340/995.12 |
| 2005/0023524 | A1* | 2/2005 | Beatty | G06F 17/30887 257/59 |
| 2005/0288836 | A1* | 12/2005 | Glass | G09B 29/106 382/293 |
| 2006/0215923 | A1* | 9/2006 | Beatty | G06T 9/00 382/253 |
| 2006/0284747 | A1* | 12/2006 | Moriya | H03M 7/24 341/51 |
| 2007/0019876 | A1* | 1/2007 | Cai | H04N 19/63 382/240 |
| 2008/0118164 | A1 | 5/2008 | Hu et al. | |
| 2008/0162519 | A1* | 7/2008 | Hsieh | G09B 29/106 |
| 2011/0025715 | A1* | 2/2011 | Uchida | H04N 1/00408 345/660 |
| 2011/0202584 | A1* | 8/2011 | Maurer | H03M 7/40 708/203 |
| 2012/0166510 | A1* | 6/2012 | Chen | G06T 9/001 708/512 |
| 2012/0268464 | A1* | 10/2012 | Dong | G06T 15/20 345/427 |
| 2012/0275723 | A1* | 11/2012 | Dong | G06T 11/203 382/295 |

FOREIGN PATENT DOCUMENTS

| | | |
|---|---|---|
| CN | 102063496 A | 5/2011 |
| CN | 102096945 A | 6/2011 |
| CN | 102255873 A | 11/2011 |
| CN | 101488141 B | 3/2014 |
| WO | 2011/082647 A1 | 7/2011 |

OTHER PUBLICATIONS

International Search Report regarding International Application No. PCT/CN2013/074364; Date of Mailing: Apr. 18, 2012; 4 pages; with English translation.
Chinese 1st Office Action corresponding to Patent No. 201310136682.4; Issue Date : Dec. 25, 2015, with English abstract.

* cited by examiner

RELEVANT METHOD AND DEVICE FOR COMPRESSION, DECOMPRESSION AND PROGRESSIVE TRANSMISSION OF SPATIAL DATA

This application is a National Stage application of PCT international application PCT/CN2013/074364, filed on Apr. 18, 2013 which claims priority to Chinese Patent Application No. 201210114177.5, entitled "METHOD AND DEVICE FOR COMPRESSING, DECOMPRESSING AND PROGRESSIVELY TRANSMITTING SPATIAL DATA", filed with the Chinese Patent Office on Apr. 18, 2012, both of which are incorporated herein by reference in their entireties.

FIELD OF THE TECHNOLOGY

The present application relates to the field of spatial information technology, computer graphics and computer operating system, particularly to a method and device for compressing, decompressing and progressively transmitting spatial data, a method for determining optimal data bits for storing compressed spatial data, a method for inserting incremental data into pre-cached spatial data, a method and device for compressing and decompressing incremental data.

BACKGROUND

View representation of spatial data is presented mainly by an electronic map. The electronic map is a visual map, which displays the spatial data on an electronic screen through hardware or software, and is a process of rasterized display of the spatial data on the electronic screen (a view window).

A view is an interface for displaying the spatial data in a view window, which is selected according to a given spatial condition. Conventionally, a process of displaying spatial data by the view is a process of rasterizing the spatial data. The process includes: first, obtaining spatial data meeting a given spatial condition, based on a spatial data index; transmitting the spatial data to a user of the spatial data, i.e., a request transmitting terminal, through a transmission medium; then performing a series of geometric transformation and procession on the spatial data to draw a raster image; and displaying or outputting the raster image on a screen, such as displaying the raster image on a computer screen, printing the raster image on paper or generating an image file to output.

As rapid development of spatial information technology, it becomes possible to obtain high resolution and high precision spatial data. Widespread applications of spatial information based on a network bring both opportunities and challenges to development and application of a Geographic Information System (GIS). Relative to a growth of a bandwidth of an existing network, amount of data for spatial information transmission renders explosive growth. In order to perform a transmission according to demands and reduce network latency, one of important approaches to achieve real time, adaptive and rapid transmission of massive spatial data of a high precision map and to solve display problems thereof is to compress the spatial data and perform a progressive transmission. The spatial data has two basic data structures, i.e., raster data and vector data. A perfect solution may be used to divide raster data into multiple blocks to perform a progressive transmission, whereas block transmission is not adapted to be divided into multiple blocks to perform a transmission due to complex spatial relationships thereof. Therefore, at present, development of research on compression and progressive transmission of spatial data with vector data structure is unsatisfactory and problems are described as following:

1. Problems in Compression:

In an existing method for compressing spatial data, a data type of spatial coordinates is generally converted from float or double to short or int. In this way, data amount is reduced by lowering data precision. However, this method cannot ensure that the compressed spatial data may achieve an unchanged display effect. Furthermore, there is no exact criterion to determine how many data bits are needed to store the compressed spatial data, i.e., there is no exact criterion to determine optimal data bits.

2. Problems in a Progressive Transmission:

By an existing technology, spatial relationships of spatial data can not keep unchanged during the progressive transmission, and a problem of large calculation amount and a low efficiency in progressive transmission can not be solved. Therefore, a preprocessing needs to be performed on original data, to achieve multiscale hierarchical storage. Reprocessing needs to be performed if the original data change. Due to multiscale hierarchical storage of spatial data, if 10 hierarchies are adopted, then the spatial data are stored in 10 hierarchies according to resolutions, and thus a lot of index data and control data are added and storage space is increased. If a resolution of spatial data during display is between resolutions of two hierarchies, the display is distorted and a progressive transmission of a lossless display can not be achieved, i.e., an adaptive progressive transmission can not be achieved. In addition, at present, progressive transmission of coordinate points is adopted in progressive transmission of spatial data. Part of data of certain coordinate points cannot be transmitted progressively according to digits of data. Only usual compression methods, such as Zip compression, are used to compress incremental data, which has a low compression ratio. Spatial relationships between pre-cached spatial data and progressively transmitted incremental data are not considered to further reduce amount of data.

From above, it can not be ensured that the arbitrarily complex vector data and the spatial relations among the vector data display correctly during the compression and the progressive transmission thereof, thus restricting practical utilization of compression and progressive transmission of the spatial data.

SUMMARY

In view of this, a method and device for compressing spatial data, a method for decompressing spatial data, a method for determining optimal data bits for storing compressed spatial data, a method and device for progressively transmitting spatial data, a method for inserting incremental data into pre-cached spatial data, a method and device for compressing incremental data, and a method for decompressing incremental data are provided in this application.

A method for compressing spatial data according to an embodiment of the application includes:

acquiring a compression parameter Z according to a preset view control parameter;

determining a reference point P according to the view control parameter;

converting coordinate values of a coordinate point of the spatial data and coordinate values of the reference point P into integers according to the compression parameter Z; and setting a difference between values obtained by converting the coordinate values of the coordinate point of the spatial data into integers and values obtained by converting the coordinate values of the reference point P into integers, as compressed data.

A device for compressing spatial data according to an embodiment of the application includes: a compression parameter acquisition unit, a reference point determination unit, a integer conversion unit and a calculation unit, where:

the compression parameter acquisition unit is configured to acquire a compression parameter Z according to a preset view control parameter;

the reference point determination unit is configured to determine a reference point P according to the view control parameter;

the integer conversion unit is configured to convert coordinate values of a coordinate point of the spatial data and coordinate values of the reference point P into integers according to the compression parameter Z; and the calculation unit is configure to set a difference between values obtained by converting the coordinate values of the coordinate point of the spatial data into integers and values obtained by converting the coordinate values of the reference point P into integers as compressed data.

A method for decompressing spatial data according to an embodiment of the application corresponds to the method above. The method includes:

acquiring a compression parameter Z and a reference point P according to a preset view control parameter, where the reference point P is the same as a reference point configured to compress the spatial data;

converting coordinate values of the reference point P into integers according to the compression parameter Z in a same way as a compression of the spatial data; and calculating a sum of data values of coordinate points of compressed spatial data and values obtained by converting the coordinate values of the reference point P into integers; and calculating values of the coordinate point of the spatial data from the sum according to the compression parameter Z in an inverse way of the compression of the spatial data, to decompress the spatial data.

A method for determining optimal data bits for storing the spatial data compressed according to the method above according to an embodiment includes:

determining optimal data bits n for storing each coordinate value of compressed spatial data according to a greater one of a width and a height of a view window in a preset view control parameter.

A method for progressively transmitting spatial data according to an embodiment includes:

sending a request for incremental data when it is determined that the incremental data are to be requested, where the request includes a transmission control parameter; and in a case that a request transmitting terminal stores pre-cached spatial data, the transmission control parameter includes a compression parameter CZ of a current view window and a compression parameter PZ of the pre-cached spatial data; and in a case that the request transmitting terminal does not store the pre-cached spatial data, the transmission control parameter includes current view control parameter; and receiving the incremental data obtained by analyzing original spatial data according to the transmission control parameter carried in the request, where the incremental data are digits of spatial data determined, by a request receiving terminal, as being not in the pre-cached spatial data and being required according to the transmission control parameter.

Another method for progressively transmitting spatial data according to an embodiment of the application includes:

receiving a request for incremental data from a request transmitting terminal, where the request includes a transmission control parameter; and in a case that a request transmitting terminal stores pre-cached spatial data, the transmission control parameter includes a compression parameter CZ of a current view window and a compression parameter PZ of the pre-cached spatial data; and in a case that the request transmitting terminal does not store the pre-cached spatial data, the transmission control parameter includes current view control parameter;

analyzing original spatial data according to the transmission control parameter carried in the request, to obtain incremental data required by the request sending terminal, where the incremental data are digits of spatial data determined, by the request receiving end, as being not in the pre-cached spatial data and being required according to the transmission control parameter, and sending the incremental data to the request transmitting terminal.

A device for progressively transmitting spatial data according to an embodiment of the application includes: a request receiving unit, an analysis unit and a data sending unit, where:

the request receiving unit is configured to receive a request for incremental data from a request transmitting terminal, where the request includes a transmission control parameter, and in a case that the request transmitting terminal stores pre-cached spatial data, the transmission control parameter includes a compression parameter CZ of a current view window and a compression parameter PZ of the pre-cached spatial data; and in a case that the request transmitting terminal does not store the pre-cached spatial data, the transmission control parameter includes a current view control parameter;

the analysis unit is configured to analyze original spatial data according to the transmission control parameter carried in the request, to obtain incremental data to be required by the request transmitting terminal, and the data sending unit is configured to send the incremental data to the request transmitting terminal.

A method for inserting incremental data into pre-cached spatial data according to an embodiment of the application includes:

calculating an enlarging ratio R of spatial data according to a view control parameter of a current view window;

calculating a compression parameter CZ of the current view window according to the enlarging ratio R;

calculating a coordinate conversion parameter CV according to the compression parameter CZ of the current view window;

determining a coordinate point P(X, Y) corresponding to incremental data (dx,dy) among pre-cached spatial data; and in a case that R is greater than or equal to 1:

if X of the P(X,Y) is greater than or equal to 0, then calculating a sum of a product of X of the P(X,Y) multiplied by CV and the dx, and dividing the sum by CV, i.e., (X*CV+dx)/CV; and if X is less than 0, then calculating a difference between the product of X of the P(X,Y) multiplied by CV and the dx, and dividing the difference by CV, i.e., (X*CV−dx)/CV; and if Y of the P(X,Y) is greater than or equal to 0, then calculating a sum of a product of Y of the P(X,Y) multiplied by CV and the dy, and dividing the sum by CV, i.e., (Y*CV+dy)/CV; and if Y is less than 0, then calculating a difference between the product of Y of the P(X,Y) multiplied by CV and the dy, and dividing the difference by CV, i.e., (Y*CV−dy)/CV; and in a case that R is less than 1:

if X of the P(X,Y) is greater than or equal to 0, then calculating a sum of a quotient of X of the P(X,Y) divided by CV and the dx, and multiplying the sum by CV, i.e., ((X/CV+dx)*CV; and if X is less than 0, then calculating a difference of a quotient of X of the P(X,Y) divided by CV and the dx, and multiplying the difference by CV, i.e., (X/CV−dx)*CV; and if Y of the P(X,Y) is greater than or equal to 0, then calculating a sum of a quotient of Y of the P(X,Y) divided by CV and the dy, and multiplying the sum by CV, i.e., (Y/CV+dy)*CV; and if Y is less than 0, then calculating a difference of the Y of the P(X,Y) divided by CV and the dy, and multiplying the difference by CV, i.e., (Y/CV−dy)*CV.

A method for compressing incremental data according to an embodiment of the application includes:

determining a reference point P of the incremental data according to a preset view control parameter; and setting a difference between the incremental data and the reference point P as compressed data.

A device for compressing incremental data according to an embodiment of the application includes: a reference point determination unit and an incremental data compression unit, where:

the reference point determination unit is configured to determine a reference point P of the incremental data according to a preset view control parameter; and the incremental data compression unit is configured to set a difference between the incremental data and the reference point P as compressed data.

A method for decompressing incremental data according to an embodiment of the application corresponds to the method above. The method includes:

determining a reference point P of the incremental data from pre-cached spatial data according to a preset view control parameter; and adding compressed incremental data to the reference point P to decompress the incremental data.

Based on the above technical solutions, with the method and device for compressing spatial data according to the embodiments of the application, the conventional problems that data amount is reduced by lowering data precision and the compressed spatial data can not be ensured to achieve an unchanged display effect are solved. A criterion to determine how many data bits are needed to store the compressed spatial data is also determined.

Based on the above technical solutions, with the method and device for progressively transmitting spatial data according to the embodiments of the application, progressive transmission of data of coordinate points according to digits of data is achieved, i.e., when a request for incremental data is sent by a request transmitting terminal, the request carries a compression parameter of a view window to be displayed. Thus, a request receiving terminal can perform analysis according to the compression parameter. When more digits of coordinate values of spatial data are needed to ensure lossless display of spatial data, the data on the digits to be added are only needed to be taken out from original spatial data and to be sent to the request transmitting terminal as incremental data, and then the request transmitting terminal inserts the incremental data after the end of the existing digits of spatial data, thus ensuring lossless display of spatial data.

Based on the above technical solutions, with the method and the device for compressing incremental data according to the embodiments of the application, compression is performed by using pre-cached spatial data as a reference point according to spatial relationships between pre-cached spatial data and progressively transmitted incremental data. Thus, no reference points for compression are needed to be transmitted and a large compression ratio is obtained. Furthermore, the method for compressing the incremental data according to the embodiments of the application is applicable to both the compression of the incremental data with the vector data structure and the compression of the incremental data with the raster data structure.

BRIEF DESCRIPTION OF THE DRAWINGS

To better describe the technical solutions in embodiments of the application or conventional technology, drawings for description of the embodiments and for conventional technology are described below briefly. Apparently, the drawings in description below are merely a few embodiments of the application. For those skilled in the art, other drawings may be obtained according to these drawings without paying any creative work.

DETAILED DESCRIPTION OF THE EMBODIMENTS

Technical solutions in embodiments of the application are clearly and completely described below in combination with drawings for the embodiments of the application. Apparently, the described embodiments are merely a few instead of all embodiments of the application. Based on the embodiments of the application, all other embodiments obtained by those skilled in the art without creative work are within the scope of the application.

For convenience of description, in the application, spatial data to be processed are called as original spatial data, coordinates of the spatial data to be processed are called as original coordinates of original spatial data, coordinate points of the spatial data to be processed are called as original coordinate points of original spatial data, or directly as original coordinate points. Embodiments of the application are described below respectively.

First Embodiment

Figure 1:
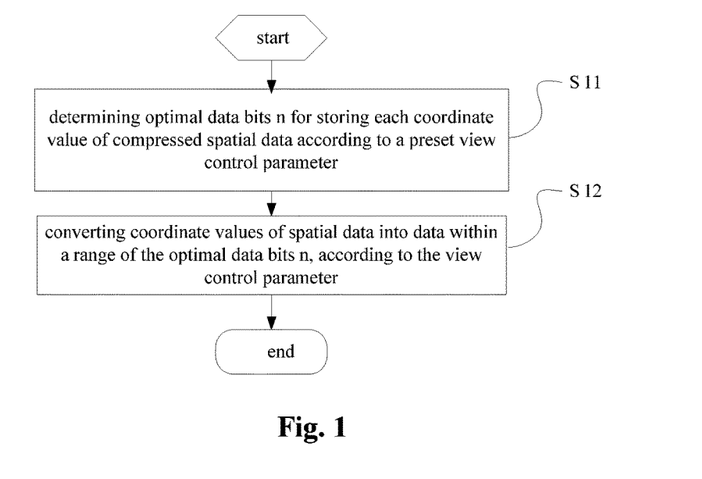
FIG. 1 is a flow chart of a method for compressing spatial data according to an embodiment of the application.

FIG. 1 shows a flow chart of a method for compressing spatial data according to an embodiment of the application. The method according to the embodiment includes step S11 and step S12.

Step S11 includes: determining optimal data bits n for storing each coordinate value of compressed spatial data according to a preset view control parameter.

The view control parameter in the embodiment includes a parameter of a bounding rectangle of a view window. The Parameter of the bounding rectangle of the view window indicates an extent (0, 0, ViewWidth, ViewHeight) of the view window displaying a spatial entity. For example, an extent of a map displaying window on a computer screen include: a width ViewWidth of the bounding rectangle of the view window and a height ViewHeight of the bounding rectangle of the view window. A size of a window for displaying a graph and an image in a practical view window can be determined based on those two parameters.

A greater one of the width and the height of the view window in the view control parameter is obtained; and the greater one is multiplied by 10 to obtain M, i.e., M=max(W,H)*10. Alternatively, a greater one of the width and the height of the view window in the view control parameter is set as M, i.e., M=max(W,H), where max indicates an acquisition of the greater one, W indicates a width of the view window, and H indicates a height of the view window.

Data bits for storing M in a computer is set as the optimal data bits n for storing each coordinate value of compressed spatial data.

Max indicates an acquisition of the greater one.

Step S12 includes: converting coordinate values of spatial data into data within a range of the optimal data bits n, according to the view control parameter.

Figure 5:
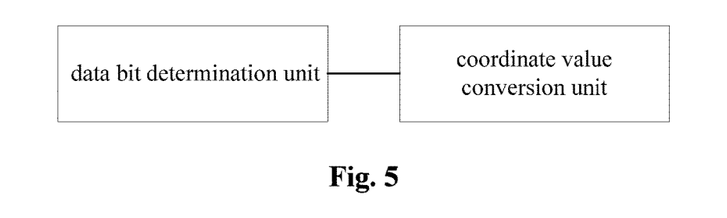
FIG. 5 is a device for compressing spatial data according to an embodiment of the application.

FIG. 5 shows a device for compressing spatial data, which corresponds to the above method for compressing the spatial data. The device includes: a data bit determination unit and a coordinate value conversion unit. The data bit determination unit is configured to determine optimal data bits n for storing coordinate values of all compressed spatial data according to a resolution (i.e., a width and a height of a view window) of a view window of a preset view control parameter. The coordinate value conversion unit is configured to convert coordinate values of spatial data into data within a range of the optimal data bits n, according to the view control parameter.

Second Embodiment

Spatial data may be displayed by performing a series of coordinate transformation on coordinate values of a coordinate point of spatial data to transform the coordinate values of the coordinate point of spatial data into pixel coordinates in a view window, and drawing a raster image with a drawing algorithm to display the raster image on a screen.

A process of transforming original coordinates of spatial data into view coordinates of the view window is as follows. Assuming that a bounding rectangle of the view window is ViewRect(0, 0, W, H), where W is a width of the bounding rectangle and H is a height of the bounding rectangle, an enlarging ratio of spatial data in the view is R, a rectangle range of spatial data displayed in the view window is (a minimum gxmin in a direction of X axis, a minimum gymin in a direction of Y axis, a maximum gxmax in the direction of X axis, a maximum gymax in the direction of Y axis), then a central point of the rectangle range of the spatial data displayed in the view window is CP(cx,cy), where cx=(gxmin+gxmax)/2, and cy=(gymin+gymax)/2.

The coordinate point of the original spatial data is p(x,y), and a pixel coordinate point in the view window coordinate system is p'(x',y'), where int indicates rounding to integer, and the coordinate transformation method for transforming p(x,y) into p'(x',y') including:

$$x'=\text{int}((x-cx)*R)+W/2; \text{ and}$$

$$y'=H/2-\text{int}((y-cy)*R).$$

Due to a limited resolution of the view window, p'(x',y') can be displayed in the view window only if p'(x',y') is within the range of the bounding rectangle ViewRect(0,0, W,H). That is, int((x−cx)*R)+W/2 is between 0 and W, and H/2−int((y−cy)*R) is between 0 and H. In the case that R is greater than or equal to 1, the number of digits of an integer part of R is set as a compression parameter Z, and 10 raised to the power of Z is set as V. Then, an effect of int((x−cx)*R) is to remove all the digits after the Z-th digits in decimal parts of x and cx. The number of digits of data reserved by int((x−cx)*V) are more than that of data obtained by rounding integer by int((x−cx)*R). Therefore, x is compressed by int(x*V−cx*V), and compressed data is dx. Dx may be decompressed by (dx+cx*V)/V. Y is compressed by int(y*V−cy*V), and compressed data is dy. Dy may be decompressed by (dy+cy*V)/V. Cx and cy indicate a reference point P. In the case that R is less than 1, 1 is subtracted from the number of digits of an integer part of a reciprocal of R, to obtain a result; and the result is set as a compression parameter Z. The compression parameter Z indicates that when spatial data are displayed in the view window, digits after the Z-th digit in an integer part will not affect the display of the spatial data in the view window. The compression method includes the follows. X is compressed by int(x/V−cx/V), and compressed data is dx. Dx may be decompressed by (dx+cx/V)*V. Y is compressed by int(y/V−cy/V), and compressed data is dy. Dy may be decompressed by (dy+cy/V)*V. Cx and cy indicate a reference point P. During the process of compression and decompression, it is ensured that the reference point for decompression is the same point as the reference point for compression. Compared with the original spatial data, the decompressed spatial data, which are compressed according to this compression method, have an unchanged display effect in the view window determined by the view control parameter.

Figure 2:
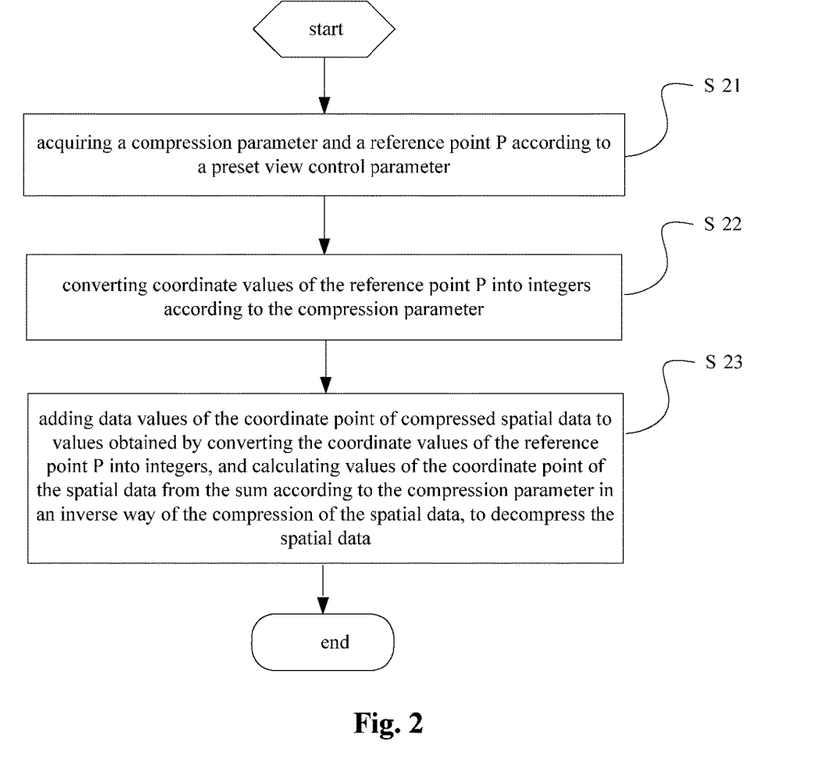
FIG. 2 is a flow chart of a method for decompressing spatial data according to an embodiment of the application.

Embodiments of a method for compressing and decompressing spatial data are described above. The method for compressing spatial data includes: acquiring a compression parameter Z according to a preset view control parameter; determining a reference point P according to the view control parameter; converting coordinate values of a coordinate point of the spatial data and coordinate values of the reference point P into integers according to the compression parameter Z; and setting a difference between values obtained by converting the coordinate values of the coordinate point of the spatial data into integers and values obtained by converting the coordinate values of the reference point P into integers, as compressed data. Referring to FIG. 2, a method for decompressing spatial data corresponds to the foregoing compression method. The method includes steps S21-S23:

Step S21 including: acquiring a compression parameter Z and a reference point P according to a preset view control parameter, where the reference point P is the same as a reference point configured to compressing the spatial data.

Step S22 including: converting coordinate values of the reference point P into integers according to the compression parameter Z in a same way as a compression of the spatial data.

Step S23 including: adding data values of the coordinate point of compressed spatial data to values obtained by converting the coordinate values of the reference point P into integers, and calculating values of the coordinate point of the spatial data from the sum according to the compression parameter Z in an inverse way of the compression of the spatial data, to decompress the spatial data.

It is noted that in the embodiment, the compression parameter Z is the number of digits of the integer part of the enlarging ratio R, or the value obtained by subtracting 1 from the number of digits of the integer part of the reciprocal of R. Ways to obtain R vary if the view control parameter includes different parameter contents. For clarity, three ways to determine R are provided below illustratively. Those skilled in the art can deduce other equivalent or modified ways.

A first way to determine an enlarging ratio R is disclosed as follows. If it is known that the view control parameter includes a width and a height of a view window and a rectangle range of spatial data displayed in the view window, a way to determine the enlarging ratio R includes: multiplying the height of the view window by the width of the view window to obtain VR; multiplying the height of the rectangle range of the spatial data displayed in the view window by the width of the rectangle range to obtain DR; dividing VR by DR to obtain a quotient and setting the quotient as the enlarging ratio R.

A second way to determine enlarging ratio R is disclosed as follows. If the view control parameter includes a width and a height of a view window and a rectangle range of spatial data displayed in the view window, R may be determined also by the following way: first determining a transverse scale and a longitudinal scale according to the width and the height of the view window and the rectangle range, i.e., the transverse scale is: double dRadioX=double(nViewWidth/rcMapBound.Width( )); and the longitudinal scale is: double dRadioY=double(nViewHeight/rcMapBound.Height( ));

where double indicates a floating precision, dRadioX indicates an enlarging ratio of spatial data in X-axis direction in the view window, and dRadioY indicates ab enlarging ratio of spatial data in Y-axis direction in the view window; nViewWidth indicates a width of the view window, nViewHeight indicates a height of the view window, rcMapBound indicates the rectangle range of spatial data displayed in the view window, rcMapBound.Width( ) indicates an acquirement of a width W of rcMapBound, and rcMapBound.Height( ) indicates an acquirement of a height of rcMapBound; and then setting a smaller one, a greater one or an average of dRadioX and dRadioY as the enlarging ratio R of the spatial data.

A third way to determine enlarging ratio R is disclosed as follows. If the view mode is a 3 dimensional mode, the view control parameter includes: a width and a height of a view window, a viewpoint parameter and a projection parameter, where the viewpoint parameter includes a position of the viewpoint in a world coordinate system, an object position observed at the viewpoint and an upward vector of a virtual camera; and the projection parameter includes an orthographic projection and a perspective projection, then a further way to determine the enlarging ratio R of spatial data displayed in a view window includes:

calculating a ratio in each coordinate axis dRadioX, dRadioY and dRadioZ according to the view control parameter, where dRadioX indicates an enlarging ratio of spatial data in X-axis direction in the view window, dRadioY indicates an enlarging ratio of spatial data in Y-axis direction in the view window, and dRadioZ indicates an enlarging ratio of spatial data in Z-axis direction in the view window. The calculation method may further includes: dividing a length of X-axis of projection of a 3 dimensional entity projected in a view window coordinate system by a length of X-axis of projection of the 3 dimensional entity projected in an original user coordinate system, to obtain dRadioX, and obtaining dRadioY and dRadioZ in the same way;

using the smallest one, the largest one, an average of dRadioX, dRadioY and dRadioZ as the enlarge ratio R, or a ratio in each axis direction as a component in that direction of the enlarging ratio R of the spatial data.

In the above three ways, the compression parameter Z is obtained directly based on R in the first way. In the other two ways, the compression parameters are determined according to whether data on digits starting from a certain digit before or after a decimal point of a coordinate value of spatial data affects the display of the spatial data in a view window. That is, in the case that R is greater than or equal to 1, when spatial data are shown in the view window, data on all digits after the Z-th digit in a decimal part of the coordinate value of the spatial data does not affect the display of the spatial data in the view window, where Z is the number of digits of an integer part of R, and Z is used as a compression parameter. In the case that R is less than 1, when spatial data are shown in the view window, data on digits after the Z-th digit in a integer part of the coordinate value of the spatial data does not affect the display of the spatial data in the view window, where Z is a number obtained by subtracting 1 from the number of digits of an integer part of a reciprocal of R, and Z is used as a compression parameter.

It is further noted that the term reference point P is mentioned for the compression and the decompression of spatial data in the embodiments above. However, a particular way to determine the reference point R is not limited in this application, which may be any way as long as the way does not impede achievement of the purpose of the application. For example, if the view control parameter includes a rectangle range of spatial data displayed in the view window, the reference point P may be determined also by the following way: determining the reference point P according to the rectangle range of the spatial data displayed in the view window, i.e., setting a central point of the rectangle range, any one vertex of the rectangle range, another point in the rectangle range or a point closest to the compressed point as the reference point P. For another example, if the view mode is a 3 dimensional mode, the view control parameter further includes a viewpoint parameter and a projection parameter. The viewpoint parameter includes a position of the viewpoint in a world coordinate system, an object position observed at the viewpoint and an upward vector of a virtual camera. The projection parameter includes orthographic projection and perspective projection. Thus, a process of determining the reference point P according to the view control parameter includes: determining the reference point P according to a view frustum determined by the view control parameter, and setting a central point of the view frustum, any one vertex of the view frustum, another point in the view frustum or a point closest to the compressed point as the reference point P.

In correspondence with the method above for compressing the spatial data, a device for compressing spatial data is further provided in the application. An embodiment of the compression device includes: a compression parameter acquisition unit, a reference point determination unit, a integer conversion unit and a calculation unit.

The compression parameter acquisition unit is configured to acquire a compression parameter Z according to a preset view control parameter.

The reference point determination unit is configured to determine a reference point P according to the view control parameter.

The integer conversion unit is configured to convert coordinate values of a coordinate point of the spatial data and coordinate values of the reference point P into integers according to the compression parameter Z.

The calculation unit is configure to set a difference between values obtained by converting the coordinate values of the coordinate point of the spatial data into integers and values obtained by converting the coordinate values of the reference point P into integers as compressed data.

Figure 6:
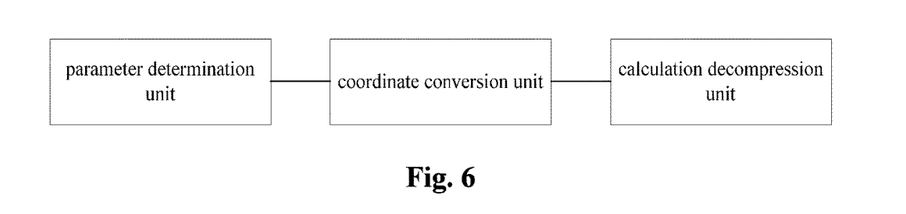
FIG. 6 is a device for decompressing spatial data according to an embodiment of the application.

An operation process of the compression device is same to the method above for compressing the spatial data, which will be omitted herein. Similarly, those skilled in the art can further construct an embodiment of a device for decompressing the spatial data in correspondence with the method for decompressing spatial data based on the illustrations above. FIG. 6 shows a device for decompressing spatial data disclosed in this embodiment. The device includes: a parameter determination unit, a coordinate conversion unit and a calculation decompression unit, where the parameter determination unit is configured to acquire a compression parameter Z and a reference point P according to a preset view control parameter, where the reference point P is the same as a reference point configured to compress the spatial data; the coordinate conversion unit is configured to convert coordinate values of the reference point P into integers according to the compression parameter Z in a same way as a compression of the spatial data; and the calculation decompression unit is configured to add data values of coordinate points of compressed spatial data to values obtained by converting the coordinate values of the reference point P into integers, and calculating values of coordinate points of the spatial data from the sum according to the compression parameter Z in an inverse way of the compression of the spatial data, to decompress the spatial data.

Third Embodiment

In the embodiments above, after the compression of spatial data, optimal data bits for storing the compressed spatial data need to be determined Therefore, a method for determining optimal data bits for storing compressed spatial data is disclosed in the application, i.e., the optimal data bits n is determined according to a greater one of a width and a height of a view window in a preset view control parameter, where the optimal data bits n is configured to store the compressed spatial data. That is, the optimal data bits for storing compressed spatial data displayed in the view window is determined by the width and the height of the view window. In particular, the method for determining n in the application may preferably include: acquiring a greater one of the width and the height of the view window in the preset view control parameter, multiplying the greater one by 10 to obtain a product, setting the number of data bits for storing the product as the optimal data bits n for storing each coordinate value of the compressed spatial data. For example, the width of the view window is 1024, and the height of the view window is 768, then 1024 multiplied by 10 equals to 10240. If 14 bits are needed for storing 10240, data of short type with a length of 2 bytes can be used for storage.

A principle of the method above is described below. A process of transforming original coordinates of spatial data into view coordinates of the view window may include the follows. Supposing that a bounding rectangle of the view window is ViewRect(0, 0, W, H), where W is a width of the bounding rectangle and H is a height of the bounding rectangle, an enlarging ratio of the spatial data in the view is R, a rectangle range of the spatial data displayed in the view window is (a minimum gxmin in a direction of X axis, a minimum gymin in a direction of Y axis, a maximum gxmax in the direction of X axis, a maximum gymax in the direction of Y axis), then a central point of the rectangle range of spatial data displayed in the view window is CP(cx,cy), where cx=(gxmin+gxmax)/2, and cy=(gymin+gymax)/2.

A coordinate point of original spatial data is p(x,y), a pixel coordinate point in the view window coordinate system is p'(x',y'), and int indicates rounding to integer. In this case, the coordinate transformation method for transforming p(x, y) into p'(x',y') includes:

$x'=int((x-cx)*R)+W/2$; and $y'=H/2-int((y-cy)*R)$.

Due to a limited resolution of the view window, p'(x',y') can be displayed in the view window only if p'(x',y') is within the range of the bounding rectangle ViewRect(0,0, W,H). That is, int((x-cx)*R)+W/2 is between 0 and W, and H/2-int ((y-cy)*R) is between 0 and H. In the case that R is greater than or equal to 1, the number of digits of an integer part of R is set as Z. Z indicates that when spatial data are displayed in the view window, data on all digits after the Z-th digit in a decimal part of the coordinate value of the spatial data will not affect the display of the spatial data in the view window. 10 raised to the power of Z is set as V, and V is greater than R and less than 10 times of R. Therefore, the value of int ((x-cx)*V)+W/2 is less than 10 times of W. Similarly, the value of H/2-int ((y-cy)*V) is less than 10 times of H. The number of digits of data reserved by int((x-cx)*V) are more than that of data obtained by rounding integer by int((x-cx)*R. An effect of int ((x-cx)*R)+W/2 is to remove all the digits after the Z-th digit in decimal parts of x and cx. In case that R is less than 1, the coordinate transformation method can be inferred in the similar way. Therefore, first a greater one of the width and the height of the view window in the preset view control parameter is acquired, and then the greater one is multiplied by 10 to obtain a product, and the number of data bits for storing the product is taken as the optimal data bits n for storing each coordinate value of the compressed spatial data. Thus, it is ensured that stored data will not be lost due to insufficient storage space, and storage space is used at the most extent.

The number of data bits for storing the greater one of the width and the height of the view window in the preset view control parameter is set as the optimal data bits n for storing each coordinate value of the compressed spatial data, so as to obtain a greater compression ratio or directly use pixel coordinate point p'(x',y') in the view window coordinate system transformed from the coordinate point of the original spatial data as compressed data.

Fourth Embodiment

It is ensured that the spatial data is displayed losslessly and an adaptive compression can be achieved, by compressing spatial data in the method according to the above embodiment, transmitting the compressed spatial data, and decompressing the compressed spatial data. Furthermore, correct display of spatial relationships among spatial data is ensured, because display effects of spatial data before and after compression are the same. When a map is zoomed in, the value of R increases. If a compression parameter Z calculated from R also increases, then more digits of a coordinate value of spatial data are needed to ensure lossless display of spatial data. The aforementioned more digits are taken from original spatial data and are inserted after the end of corresponding pre-cached spatial data, so as to ensure lossless display of spatial data and achieve the progressive transmission of vector data.

Due to a limited resolution of a view window, when spatial data with a high resolution are displayed in the view window, data is configured to present details of spatial data. For example, coordinate points of vector data or data units (pixels) of raster data will be drawn on a same pixel in the view window. In this condition, it needs only to draw one coordinate point or one data unit on the pixel, and thus ensuring the lossless display of the spatial data. Other coordinate points or data units drawn on this pixel can be removed. When the map is zoomed in, the spatial data displayed on the screen will fill more pixels (the figure for display the spatial data is larger), and more coordinate points or data units are needed to present details of the spatial data. In this condition, it needs only to take these coordinate points or data units (incremental data) from the original spatial data, and insert them to corresponding existing spatial data to ensure the lossless display of the spatial data. For compression of the added coordinate points or data units, a reference point P is selected. Particularly, values closest to the coordinate points or the data units may be selected and differences between the value and the coordinate points or the data units are calculated. For example, the reference point P is a coordinate point or data unit already in the pre-cached data, which is drawn on a same pixel where the added coordinate point or data unit are drawn in a view window determined by a view control parameter recorded in the pre-cached spatial data during display of the spatial data. In this way, differences between the reference point and the added coordinate points or data units are small; amount of data to be stored is small. In addition, no reference point P needs to be transmitted, and thus amount of transmitted data is further reduced, and the compression and the progressive transmission of the spatial data are achieved. The compression and progressive transmission method is applicable to both vector data and raster data. For raster data, if the difference is smaller than or equal to a preset value, no data need to be transmitted, and pre-cached data units (pixels) corresponding to the reference point P are uses for substitution. Progressive transmission of spatial data, inserting incremental data into pre-cached spatial data (a fifth embodiment), compression of incremental data (a sixth embodiment) are described below with embodiments respectively.

The progressive transmission of the spatial data may be described from a perspective of a request transmitting terminal or from a perspective of a request receiving terminal. For a request transmitting terminal, referring to FIG. 3, a method for progressively transmitting spatial data in the embodiment includes step S61 and step S62.

Figure 3:
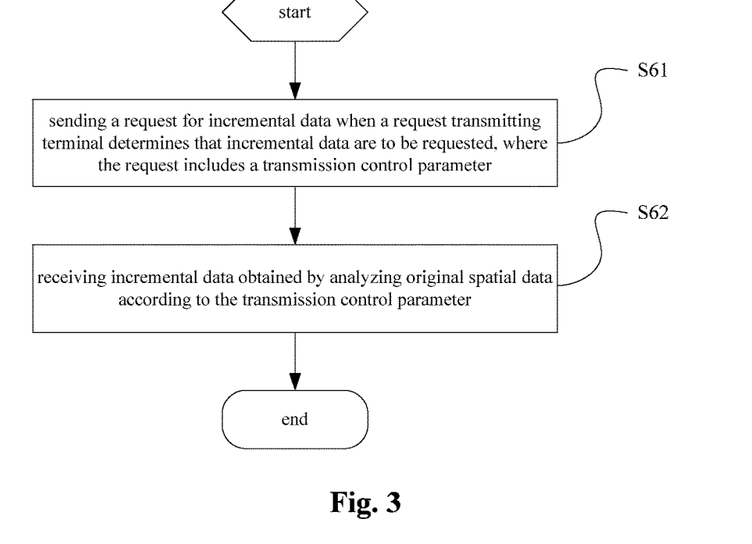
FIG. 3 is a flow chart of a method for progressively transmitting spatial data at a request transmitting terminal according to an embodiment of the application.

Step S61 includes: sending a request for incremental data when a request transmitting terminal determines that incremental data are to be requested, where the request includes a transmission control parameter. Contents of the transmission control parameter vary with a state of the request transmitting terminal. For example, if pre-cached spatial data are stored in the request transmitting terminal, the transmission control parameter includes a compression parameter CZ of a current view window and a compression parameter PZ of the pre-cached spatial data, or a compression parameter of a current view window and position information of coordinate points of the pre-cached spatial data in original spatial data. Thus, a request receiving terminal can perform simplification analysis on the spatial data to obtain incremental data according to the transmission control parameter. If the pre-cached spatial data are not stored in the request transmitting terminal, the transmission control parameter includes current view control parameter.

Step S62 includes: receiving incremental data obtained by analyzing original spatial data according to the transmission control parameter, where the incremental data are digits of spatial data determined, by a request receiving terminal, as being not in the pre-cached spatial data and being required according to the transmission control parameter.

In the above steps, the request for the incremental data is sent only when the incremental data are needed to be requested. There is multiple ways to determine whether incremental data are needed. In this embodiment, two ways are provided preferably as follows.

A first way includes:

calculating an enlarging ratio R of spatial data according to a view control parameter of a current window;

calculating a compression parameter CZ of the current view window according to the enlarging ratio R;

determining whether a compression parameter PZ of the pre-cached spatial data is less than the compression parameter CZ of the current view window in case that R is greater than or equal to 1; determining that incremental data are requested in the case that the compression parameter PZ of the pre-cached spatial data is less than the compression parameter CZ of the current view window; else determining that incremental data are not requested; and determining whether a compression parameter PZ of the pre-cached spatial data is greater than the compression parameter CZ of the current view window in the case that R is less than 1; determining that the incremental data are requested in the case that the compression parameter PZ of the pre-cached spatial data is greater than the compression parameter CZ of the current view window; else determining that the incremental data are not requested.

A second way includes:

calculating an enlarging ratio R of spatial data according to a view control parameter of a current window;

calculating a compression parameter CZ of the current view window according to the enlarging ratio R;

determining whether a compression parameter PZ of the pre-cached spatial data is less than the compression parameter CZ of the current view window in the case that R is greater than or equal to 1; determining that the incremental data are requested in the case that the compression parameter PZ of the pre-cached spatial data is less than the compression parameter CZ of the current view window; and determining whether R is greater than a preceding enlarging ratio recorded in the pre-cached spatial data in the case that the compression parameter PZ of the pre-cached spatial data is not less than the compression parameter CZ of the current view window; and determining that the incremental data are requested in the case that R is greater than the preceding enlarging ratio; else determining that the incremental data are not requested; and determining whether the compression parameter PZ of the pre-cached spatial data is greater than the compression parameter CZ of the current view window in the case that R is less than 1; determining that the incremental data are requested in the case that the compression parameter PZ of the pre-cached spatial data is greater than the compression parameter CZ of the current view window; and determining whether R is greater than a preceding enlarging ratio recorded in the pre-cached spatial data in the case that the compression parameter PZ of the pre-cached spatial data is not greater than the compression parameter CZ of the current view window; determining that the incremental data are requested in the case that R is greater than the preceding enlarging ratio; else determining that the incremental data are not requested.

In the second way, the transmission control parameter may further include an enlarging ratio R of spatial data of a current view window.

Figure 4:
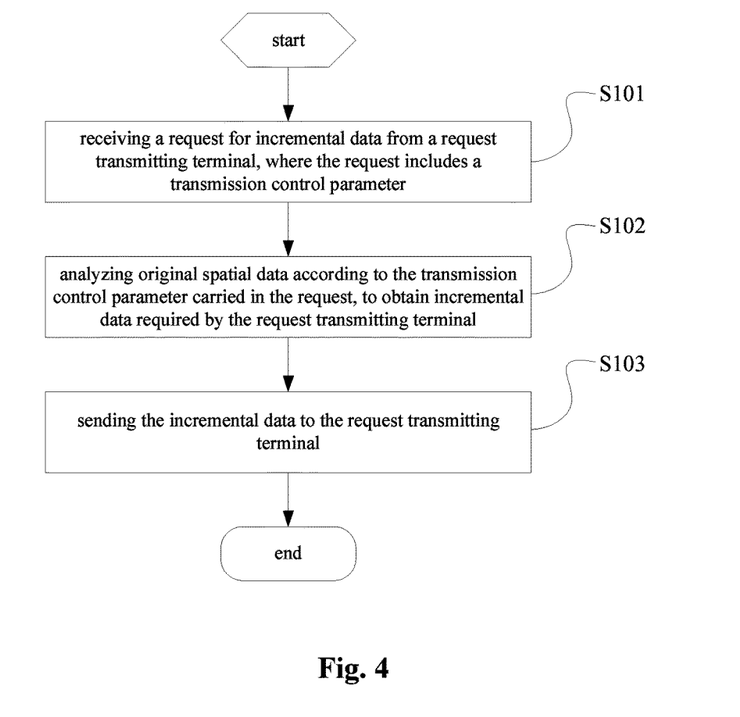
FIG. 4 is a flow chart of a method for progressively transmitting spatial data at a request receiving terminal according to an embodiment of the application.

For a request receiving terminal, referring to FIG. 4, the method for progressively transmitting spatial data in the embodiment includes steps S101-S103.

Step S101 includes: receiving a request for incremental data from a request transmitting terminal, where the request includes a transmission control parameter. Consistent with the foregoing description of for a request transmitting terminal, Contents of the transmission control parameter are relative to a state of the request transmitting terminal, i.e., if pre-cached spatial data are stored in the request transmitting terminal, the transmission control parameter includes a compression parameter CZ of a current view window and a compression parameter PZ of the pre-cached spatial data, and if the pre-cached spatial data are not stored in the request transmitting terminal, the transmission control parameter includes current view control parameter.

Step S102 includes: analyzing original spatial data according to the transmission control parameter carried in the request, to obtain incremental data to be required by the request transmitting terminal.

And step S103 includes: sending the incremental data to the request transmitting terminal.

Under a condition that the pre-cached spatial data are stored in the request transmitting terminal, the step of analyzing original spatial data according to the transmission control parameter carried in the request, to obtain incremental data to be required by the request transmitting terminal may be implemented in the multiple ways, and two implementations are given below illustratively. Those skilled in the art can obtain other implementations by equivalent transformation based on the implementations.

A first implementation of analyzing the original spatial data to obtain incremental data to be required by the request transmitting terminal includes:

1) calculating a coordinate conversion parameter CV according to the compression parameter CZ of the current view window, where CV equals to 10 raised to a power of CZ, i.e., $CV=10^{CZ}$;

2) calculating the number DB of digits of a coordinate value of spatial data to be taken out, according to the compression parameter CZ of the current view window and a compression parameter PZ of pre-cached spatial data, i.e., DB=CZ−PZ;

3) calculating an acquisition parameter DV of the digits according to the DB, where DV equals to 10 raised to a power of DB, i.e., $DV=10^{DB}$;

4) acquiring the incremental data DP(DX,DY) from a coordinate point P(X,Y) of spatial data where incremental data are needed to be acquired, according to the coordinate conversion parameter CV and DV.

The step 4 further includes: firstly converting coordinate values of the coordinate point P(X, Y) into integers according to CV, and calculating absolute values xValue and yValue of the integers, $x\text{Value}=\text{abs}(X*CV)$;

$y\text{Value}=\text{abs}(Y*CV)$;

and then acquiring the required incremental data DP(DX, DY), $DX=x\text{Value}-\text{int}(x\text{Value}/DV)*DV$;

$DY=y\text{Value}-\text{int}(y\text{Value}/DV)*DV$;

where abs indicates a calculation of the absolute value, and int indicates rounding to integer.

A second implementation of analyzing the original spatial data to obtain incremental data to be required by the request transmitting terminal includes the follow steps.

Original spatial data are simplified according to a preceding enlarging ratio recorded in pre-cached spatial data to obtain a preceding simplification result, and incremental data corresponding to pre-cached spatial data are obtained according to spatial data of the preceding simplification result, which further includes:

1) calculating a compression parameter CZ of a current view window according to a current enlarging ratio of the current view window;

2) calculating a coordinate conversion parameter CV according to the compression parameter CZ of the current view window, where CV equals to 10 raised to a power of CZ, i.e., $CV=10^{CZ}$;

3) calculating the number DB of digits of a coordinate value of spatial data to be taken out, according to the compression parameter CZ of the current view window and a compression parameter PZ of pre-cached spatial data, i.e., DB=CZ−PZ;

4) calculating an acquisition parameter DV of the digits according to the DB, where DV equals to 10 raised to a power of DB, i.e., $DV=10^{DB}$;

5) acquiring the incremental data DP(DX,DY) from a coordinate point P(X,Y) of spatial data where incremental data are needed to be acquired, according to the coordinate conversion parameter CV and DV.

The step 5 further includes: first, converting coordinate values of the coordinate point P(X, Y) into integers according to CV, and calculating absolute values xValue and yValue of the integers, $x\text{Value}=\text{abs}(X*CV)$;

$y\text{Value}=\text{abs}(Y*CV)$;

and then acquiring the required incremental data DP(DX, DY), $DX=x\text{Value}-\text{int}(x\text{Value}/DV)*DV$;

$DY=y\text{Value}-\text{int}(y\text{Value}/DV)*DV$;

where abs indicates a calculation of the absolute value, and int indicates rounding to integer.

The original spatial data is simplified and analyzed according to the current enlarging ratio of the current view window and the preceding simplification result, to obtain new coordinate points. That is, an original coordinate point that is in the current simplification result but is not in the preceding simplification result is determined as the added coordinate point. Compressed data of the added coordinate point is obtained by performing following processing on the data of the added coordinate point;

calculating a coordinate conversion parameter CV according to the compression parameter CZ of the current view window, where CV equals to 10 raised to a power of CZ, i.e., $CV=10^{CZ}$;

setting a coordinate point or a data unit already in pre-cached spatial data and drawn on a same pixel as the added coordinate points or data units which are drawn in a view window determined by a view control parameter recorded in the pre-cached spatial data during display of the spatial data, as a reference point $P(X_r, Y_r)$;

converting the coordinate values of the added coordinate points and coordinate values $X_r$ and $Y_r$ of the reference point $P(X_r, Y_r)$ into integers according to the coordinate conversion parameter CV;

setting a difference between values obtained by converting the coordinate values of the added coordinate points into integers and values obtained by converting the coordinate values of the reference point $P(X_r, Y_r)$ into integers, as compressed data of the added coordinate points.

The obtained incremental data corresponding to the pre-cached spatial data and the compressed data of the coordinate values of the added coordinate points is set as the incremental data required by the request transmitting terminal.

Compression of the added coordinate points used as the incremental data is achieved through the implementation (the second implementation).

Under a condition that pre-cached spatial data are not stored in the request transmitting terminal, the step of analyzing original spatial data according to the transmission control parameter carried in the request, to obtain incremental data to be required by the request transmitting terminal may be performed by compressing the original spatial data according to the view control parameter of the current view window; and setting the compressed spatial data as the incremental data.

Figure 8:
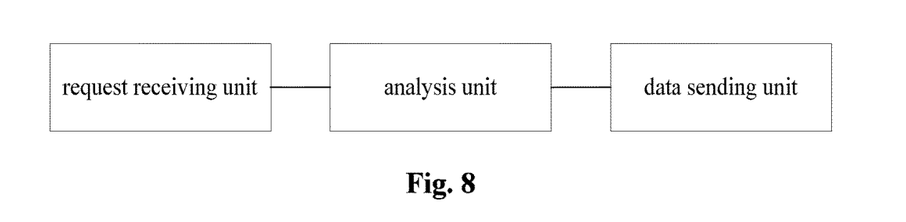
FIG. 8 is a device for progressively transmitting spatial data at a request receiving terminal according to an embodiment of the application.

A method for progressively transmitting spatial data is described in detail in the above description of the embodiment. In accordance with the method, a device for progressively transmitting spatial data is further provided in the application. Referring to FIG. 8, the device includes: a request receiving unit, an analysis unit and a data sending unit.

The request receiving unit is configured to receive a request for incremental data from a request transmitting terminal, where the request includes a transmission control parameter, and in a case that the request transmitting terminal stores pre-cached spatial data, the transmission control parameter includes a compression parameter CZ of a current view window and a compression parameter PZ of the pre-cached spatial data, and in a case that the request transmitting terminal does not store the pre-cached spatial data, the transmission control parameter includes a current view control parameter.

The analysis unit is configured to analyzing original spatial data according to the transmission control parameter carried in the request, to obtain incremental data to be required by the request transmitting terminal.

The data sending unit is configured to send the incremental data to the request transmitting terminal.

Figure 7:
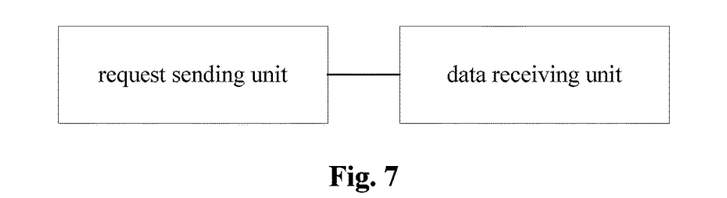
FIG. 7 is a device for progressively transmitting spatial data at a request transmitting terminal according to an embodiment of the application.

An operation process of the device for progressively transmitting spatial data is same to the method above for progressively transmitting the spatial data, which will be omitted herein. It is noted that the device for progressively transmitting the spatial data is described only from a perspective of a request receiving terminal, and those skilled in the art can further construct a devices for progressively transmitting the spatial data described from a perspective of a request transmitting terminal based on the foregoing content. FIG. 7 shows a device for progressively transmitting spatial data described from a perspective of a request transmitting terminal disclosed in the embodiment of the application. The device includes a request sending unit and a data receiving unit. The request sending unit is configured to send a request for incremental data when it is determined that the incremental data are to be requested, the request includes a transmission control parameter; in a case that a request transmitting terminal stores pre-cached spatial data, the transmission control parameter includes a compression parameter CZ of a current view window and a compression parameter PZ of the pre-cached spatial data; and in a case that the request transmitting terminal does not store the pre-cached spatial data, the transmission control parameter includes a current view control parameter. The data receiving unit is configured to receive the incremental data obtained by analyzing original spatial data according to the transmission control parameter carried in the request.

Fifth Embodiment

As described above, the received incremental data need to be inserted into the pre-cached spatial data. Thus, a lossless display of spatial data can be ensured even if enlarging ratio of a map changes. A method for inserting incremental data into pre-cached spatial data provided in the application includes:

calculating an enlarging ratio R of spatial data according to a control parameter of a current view window;

calculating a compression parameter CZ of the current view window according to the enlarging ratio R;

calculating a coordinate conversion parameter CV according to the compression parameter CZ of the current view window;

determining a coordinate point P(X, Y) corresponding to incremental data (dx,dy) among pre-cached spatial data; and in a case that R is greater than or equal to 1:

if X of the P(X,Y) is greater than or equal to 0, then calculating a sum of a product of X of the P(X,Y) multiplied by the CV and the dx, and dividing the sum by the CV, i.e., (X*CV+dx)/CV; and if X is less than 0, then calculating a difference between the product of X of the P(X,Y) multiplied by the CV and the dx, and dividing the difference by the CV, i.e., (X*CV−dx)/CV; and if Y of the P(X,Y) is greater than or equal to 0, then calculating a sum of a product of Y of the P(X,Y) multiplied by the CV and the dy, and dividing the sum by the CV, i.e., (Y*CV+dy)/CV; and if Y is less than 0, then calculating a difference between the product of Y of the P(X,Y) multiplied by the CV and the dy, and dividing the difference by the CV, i.e., (Y*CV−dy)/CV; and in a case that R is less than 1:

if X of the P(X,Y) is greater than or equal to 0, then calculating a sum of a quotient of X of the P(X,Y) divided by the CV and the dx, and multiplying the sum by the CV, i.e., ((X/CV+dx)*CV; and if X is less than 0, then calculating a difference of a quotient of X of the P(X,Y) divided by the CV and the dx, and multiplying the difference by the CV, i.e., (X/CV−dx)*CV; and if Y of the P(X,Y) is greater than or equal to 0, then calculating a sum of a quotient of Y of the P(X,Y) divided by the CV and the dy, and multiplying the sum by the CV, i.e., (Y/CV+dy)*CV; and if Y is less than 0, then calculating a difference of the Y of the P(X,Y) divided by the CV and the dy, and multiplying the difference by the CV, i.e., (Y/CV−dy)*CV.

Added digits of incremental data are inserted into the pre-cached spatial data according to the steps above. If the incremental data includes added coordinate points, following steps are performed:

determining a reference point $P(X_r, Y_r)$ for the added coordinate point XP(xdx, xdy) of the incremental data from pre-cached spatial data, decompressing the added coordinate point XP(xdx, xdy) of the incremental data, to obtain a decompressed coordinate point JP(jdx, jdy);

in the case that R is greater than or equal to 1, calculating a sum of a product of $X_r$ of the $P(X_r,Y_r)$ multiplied by CV and xdx, and dividing the sum of the product and the xdx by CV, i.e., jdx=$(X_r*CV+xdx)$/CV; and calculating a sum of a product of $Y_r$ of the $P(X_r,Y_r)$ multiplied by CV and xdy, and dividing the sum of the product and the xdy by CV, i.e., jdy=$(Y_r*CV+xdy)$/CV;

in the case that R is less than 1, calculating a sum of a quotient of $X_r$ of the $P(X_r,Y_r)$ divided by CV and xdx, and multiplying the sum of the quotient and the xdx by CV, i.e., jdx=$(X_r/CV+xdx)*CV$; and calculating a sum of a quotient of $Y_r$ of the $P(X_r,Y_r)$ divided by CV and xdy, and multiplying the sum of the quotient and the xdy by CV, i.e., jdy=$(Y_r/CV+xdy)*CV$; and inserting the decompressed coordinate point JP(jdx,jdy) after reference point $P(X_r,Y_r)$.

After the incremental data is inserted, the method according to the application further includes: substituting the compression parameter of the pre-cached spatial data with the compression parameter of the current view window, and substituting the preceding enlarging ratio of the pre-cached spatial data with the current enlarging ratio R.

Sixth Embodiment

A method for compressing incremental data is mentioned in the process of analyzing original spatial data according to the transmission control parameter carried in the request, to obtain incremental data to be required by the request transmitting terminal" in the embodiments above. The process may independently be a method for compressing incremental data, which is the sixth embodiment of the application. The embodiment includes step 1 and step 2.

Step 1 includes: determining a reference point P of incremental data according to a preset view control parameter; where the view control parameter may include a width W and a height H of a view window. In addition, under certain conditions, the view control parameter may further include other contents. For example, if the view mode is a 2 dimensional mode, the view control parameter further includes a rectangle range of spatial data displayed in the view window. If the view mode is a 3 dimensional mode, the view control parameter further includes a viewpoint parameter and a projection parameter, where the viewpoint parameter includes a position of the viewpoint in a world coordinate system, an object position observed at the viewpoint and an upward vector of a virtual camera; and the projection parameter includes an orthographic projection and a perspective projection.

And step 2 includes: setting a difference between the incremental data and the reference point P as compressed data.

In the above step 1, multiple ways can be adopted to determine the reference point P, as long as the way does not impede achievement of the purpose of the application. In the application, preferably, the step of determining a reference point P of incremental data according to a preset view control parameter may include: setting spatial data which are already in the pre-cached spatial data and are drawn on a same pixel as the incremental data displayed in a view window determined by the view control parameter, as the reference point P. In particular, the preferable way can be achieved according to following steps: transforming a coordinate of the incremental data according to the view control parameter to obtain a view coordinate PV in a view window determined by the view control parameter; determining spatial data already in the pre-cached spatial data as the reference point P, where the spatial data is spatial data with a view coordinate PV in a view window determined by the view control parameter, and the view control parameter is obtained by performing a coordinate transformation on the spatial data. Further, the preferable way can be achieved according to following steps: obtaining a coordinate unit in a view window according to the view control parameter, and obtaining a length vLength of original spatial data in an original coordinate system represented by the coordinate unit; determining spatial data according to view control parameter, where the spatial data are already in the pre-cached spatial data and a distance between a coordinate point of the spatial data and a coordinate point of the incremental data is less than vLength, and setting the determined coordinate point of the spatial data as the reference point P.

A process of compressing incremental data is described in the method above. In correspondence, a process of decompressing incremental data is further disclosed in the application, which includes: determining a reference point P of the incremental data from pre-cached spatial data according to a preset view control parameter; and adding compressed incremental data to the reference point P to decompress the incremental data.

In correspondence with the method above, a device for compressing incremental data is further disclosed in the application. The device includes: a reference point determination unit and an incremental data compression unit. The reference point determination unit is configured to determine a reference point P of the incremental data according to a preset view control parameter; and the incremental data compression unit is configured to set a difference between the incremental data and the reference point P as compressed data. It is noted that besides the device for compressing the incremental data, those skilled in the art can construct devices for compressing incremental data based on the foregoing content.

The data processing device disclosed in the application may be set in a computer, in a mobile phone or in other devices which can apply the application, or in other smart device. The data processing device disclosed in the application may be set at a request receiving terminal, to process spatial data before sending data required by a request transmitting terminal. Alternatively, the data processing device disclosed in the application may be set at a request transmitting terminal, to process data before sending the data to an actual view window. Alternatively, the data processing device disclosed in the application may be set both in a server and at a request transmitting terminal, and data may be processed by one or both of the server and the request transmitting terminal as required.

The embodiments are described in a progressive manner in the specification. The description of each embodiment focuses on differences from other embodiments, and same or similar parts of various embodiments can be referred with each other. For the device disclosed in the embodiments, because the device is in correspondence with the method disclosed in the embodiments, the description is simple and relative information can be seen by referring to description of the method.

Those skilled in the art may understand that units and steps of algorithms illustrated in the embodiments disclosed in the application can be realized with electronic hardware, computer software or combination of both. Components and steps of each illustration are described in general in the description above according to functions to clearly explain the interchangeability of hardware and software. Whether the functions are performed by hardware or software depends on particular applications of the solution and constraint conditions of design. Those skilled in the art may apply different methods on respective particular applications to implement the described functions, which will not be considered beyond the scope of this application.

Steps combined with the methods or the algorithms described in the embodiments of the application can be implemented with hardware, software modules, or a combination thereof. Software modules may be set in a Random-Access Memory (RAM), a memory, a Read-Only Memory (ROM), an electrically programmable ROM, an electrically erasable programmable ROM, a register, a hard disk, a removable disk, a CD-ROM or any other forms of storage media known in the art.

The foregoing description of the disclosed embodiments enables those skilled in the art to realize or use the application. Various modifications to the embodiments are obvious to those skilled in the art, and the general principle defined in the application can be realized in other embodiments without departing from the spirit or scope of the application. Therefore, the application is not to be limited to the embodiments shown in the application, but to meet a broadest scope consistent with the principle and the novel features disclosed in the application.

The invention claimed is:

1. A method for processing spatial data, comprising:
   acquiring, by a processor, a compression parameter Z according to a preset view control parameter, wherein the preset view control parameter comprises a width and a height of a view window for displaying the spatial data and a rectangle range of spatial data displayed in the view window;
   determining, by the processor, a reference point P according to the rectangle range of spatial data displayed in the view window;
   converting, by the processor, coordinate values of a coordinate point of the spatial data and coordinate values of the reference point P into integers according to the compression parameter Z; and
   setting, by the processor, a difference between values obtained by converting the coordinate values of the coordinate point of the spatial data into integers and values obtained by converting the coordinate values of the reference point P into integers, as compressed data, to compress the spatial data.

2. The method according to claim 1, wherein the acquiring, by a processor, a compression parameter Z according to a preset view control parameter comprising:
   multiplying the height of the view window by the width of the view window, to obtain VR;
   multiplying a height of the rectangle range of the spatial data displayed in the view window by a width of the rectangle range, to obtain DR;
   obtaining an enlarging ratio R by dividing VR by DR;
   setting the number of digits of an integer part of R as the compression parameter Z, in a case that R is greater than or equal to 1; and
   setting the number of digits of an integer part of a reciprocal of R as the compression parameter Z, in a case that R is less than 1.

3. The method according to claim 2, wherein
converting the coordinate values of coordinate points of the spatial data and coordinate values $X_r$ and $Y_r$ of the reference point $P(X_r,Y_r)$ into integers according to the compression parameter Z comprises:
1) calculating a coordinate conversion parameter V according to the compression parameter Z calculated from the enlarging ratio R, wherein the V equals to 10 raised to a power of Z, i.e., $V=10^Z$;
2) converting coordinate values $X_r$ and $Y_r$ of the reference point $P(X_r,Y_r)$ into integers RX and RY according to the coordinate conversion parameter V,
in a case that R is greater than or equal to 1, obtaining RX by rounding a product of $X_r$ multiplied by V to an integer, and obtaining RY by rounding a product of $Y_r$ multiplied by V to an integer; and in a case that R is less than 1, obtaining RX by rounding a quotient of $X_r$ divided by V to an integer, and obtaining RY by rounding a quotient of $Y_r$ divided by V to an integer;
3) setting an original coordinate point to be compressed in the spatial data as a coordinate point to be processed $P_i(X_i,Y_i)$, and converting coordinate values of the coordinate point to be processed $P_i(X_i,Y_i)$ into integers $IX_i$ and $IY_i$,
in a case that R is greater than or equal to 1, obtaining $IX_i$ by rounding a product of $X_i$ multiplied by V to an integer part, and obtaining $IY_i$ by rounding a product of $Y_i$ multiplied by V to an integer; and in a case that R is less than 1, obtaining $IX_i$ by rounding a quotient of $X_i$ divided by V to an integer, and obtaining $IY_i$ by rounding a quotient of $Y_i$ divided by V to an integer;
the setting a difference between values obtained by converting the coordinate values of the coordinate point of the spatial data into integers and values obtained by converting the coordinate values of the reference point P into integers, as compressed data, comprising
setting a difference between values $IX_i$ and $IY_i$ obtained by converting the coordinate values of the coordinate point $P_i(X_i,Y_i)$ of the spatial data into integers and values RX and RY obtained by converting the coordinate values $X_r$ and $Y_r$ of the reference point $P(X_r,Y_r)$ into integers as the compressed data $DP(DX_i,DY_i)$ of the spatial coordinate point $P_i(X_i,Y_i)$,
wherein $DX_i=IX_i-RX$;
$DY_i=IY_i-RY$.

4. The method according to claim 2, further comprising:
acquiring, by the processor, a compression parameter Z and a reference point P according to a preset view control parameter, wherein the reference point P is the same as a the reference point configured to compress the spatial data;
converting, by the processor, coordinate values of the reference point P into integers according to the compression parameter Z in a same way as a compression of the spatial data; and
calculating, by the processor, a sum of data values of coordinate points of compressed spatial data and values obtained by converting the coordinate values of the reference point P into integers, and calculating values of coordinate points of the spatial data from the sum according to the compression parameter Z in an inverse way of the compression of the spatial data to finish decompression of the spatial data.

5. The method according to claim 2, further comprising:
determining, by the processor, data bits n for storing each coordinate value of compressed spatial data according to a greater one of a width and a height of a view window in a preset view control parameter.

6. The method according to claim 1, wherein the acquiring, by a processor, a compression parameter Z according to a preset view control parameter comprising:
determining that data on digits after a Z-th digit in a decimal part or an integer part of a coordinate value of a coordinate point of the spatial data does not affect a display of the spatial data in the view window, when the spatial data is determined by the view control parameter to be displayed in the view window determined by the view control parameter; and
setting the Z as the compression parameter.

7. The method according to claim 6, wherein the determining that data on digits after a Z-th digit in a decimal part or an integer part of a coordinate value of a coordinate point of the spatial data are not affect a display of the spatial data in the view window comprises:
calculating an enlarging ratio R of the spatial data displayed in the view window according to the view control parameter;
setting the number of digits of an integer part of the R as a compression parameter Z, in a case that R is greater than or equal to 1, indicating that digits after the Z-th digit in a decimal part does not affect a display of the spatial data in the view window when the spatial data are displayed in the view window; and
obtain a different between the number of digits of an integer part of a reciprocal of the R and 1, setting the difference as the compression parameter Z in a case that R is less than 1, indicating that digits after the Z-th digit in an integer part does not affect the display of the spatial data in the view window when the spatial data are displayed in the view window.

8. The method according to claim 7, wherein the calculating an enlarging ratio R of the spatial data displayed in the view window according to the view control parameter comprises:
determining a transverse scale and a longitudinal scale according to the view control parameter, wherein
the transverse scale is double precision, which is calculated by an expression
double dRadioX=double (nViewWidth/rcMapBound.Width( )); and
the longitudinal scale is double precision, which is calculated by an expression double dRadioY=double (nViewHeight/rcMapBound.Height( ));
wherein dRadioX indicates an enlarging ratio of the spatial data in X-axis direction in the view window, and dRadioY indicates an enlarging ratio of the spatial data in Y-axis direction in the view window; nViewWidth indicates the width of the view window, nViewHeight indicates the height of the view window, rcMapBound indicates the rectangle range of spatial data displayed in the view window, rcMapBound.Width( ) indicates an acquirement of a width W of rcMapBound, and rcMapBound.Height( ) indicates an acquirement of a height W of rcMapBound; and
setting a smaller one, a greater one or an average of dRadioX and dRadioY as the enlarging ratio R of the spatial data.

9. The method according to claim 8, wherein
converting the coordinate values of coordinate points of the spatial data and coordinate values $X_r$ and $Y_r$ of the reference point $P(X_r,Y_r)$ into integers according to the compression parameter Z comprises:
1) calculating a coordinate conversion parameter V according to the compression parameter Z calculated from the enlarging ratio R, wherein the V equals to 10 raised to a power of Z, i.e., $V=10^Z$;
2) converting coordinate values $X_r$ and $Y_r$ of the reference point $P(X_r,Y_r)$ into integers RX and RY according to the coordinate conversion parameter V,
in a case that R is greater than or equal to 1, obtaining RX by rounding a product of $X_r$ multiplied by V to an integer, and obtaining RY by rounding a product of $Y_r$ multiplied by V to an integer; and in a case that R is less than 1, obtaining RX by rounding a quotient of $X_r$ divided by V to an integer, and obtaining RY by rounding a quotient of $Y_r$ divided by V to an integer;
3) setting an original coordinate point to be compressed in the spatial data as a coordinate point to be processed $P_i(X_i,Y_i)$, and converting coordinate values of the coordinate point to be processed $P_i(X_i,Y_i)$ into integers $IX_i$ and $IY_i$,
in a case that R is greater than or equal to 1, obtaining $IX_i$ by rounding a product of $X_i$ multiplied by V to an integer part, and obtaining $IY_i$ by rounding a product of $Y_i$ multiplied by V to an integer; and in a case that R is less than 1, obtaining $IX_i$ by rounding a quotient of $X_i$ divided by V to an integer, and obtaining $IY_i$ by rounding a quotient of $Y_i$ divided by V to an integer;
the setting a difference between values obtained by converting the coordinate values of the coordinate point of the spatial data into integers and values obtained by converting the coordinate values of the reference point P into integers, as compressed data, comprising
setting a difference between values $IX_i$ and $IY_i$ obtained by converting the coordinate values of the coordinate point $P_i(X_i,Y_i)$ of the spatial data into integers and values RX and RY obtained by converting the coordinate values $X_r$ and $Y_r$ of the reference point $P(X_r,Y_r)$ into integers as the compressed data $DP(DX_i,DY_i)$ of the spatial coordinate point $P_i(X_i,Y_i)$,
wherein $DX_i=IX_i-RX$;
$DY_i=IY_i-RY$.

10. The method according to claim 7, wherein
converting the coordinate values of coordinate points of the spatial data and coordinate values $X_r$ and $Y_r$ of the reference point $P(X_r,Y_r)$ into integers according to the compression parameter Z comprises:
1) calculating a coordinate conversion parameter V according to the compression parameter Z calculated from the enlarging ratio R, wherein the V equals to 10 raised to a power of Z, i.e., $V=10^Z$;
2) converting coordinate values $X_r$ and $Y_r$ of the reference point $P(X_r,Y_r)$ into integers RX and RY according to the coordinate conversion parameter V,
in a case that R is greater than or equal to 1, obtaining RX by rounding a product of $X_r$ multiplied by V to an integer, and obtaining RY by rounding a product of $Y_r$ multiplied by V to an integer; and in a case that R is less than 1, obtaining RX by rounding a quotient of $X_r$ divided by V to an integer, and obtaining RY by rounding a quotient of $Y_r$ divided by V to an integer;
3) setting an original coordinate point to be compressed in the spatial data as a coordinate point to be processed $P_i(X_i,Y_i)$, and converting coordinate values of the coordinate point to be processed $P_i(X_i,Y_i)$ into integers $IX_i$ and $IY_i$, in a case that R is greater than or equal to 1, obtaining $IX_i$ by rounding a product of $X_i$ multiplied by V to an integer part, and obtaining $IY_i$ by rounding a product of $Y_i$ multiplied by V to an integer; and in a case that R is less than 1, obtaining $IX_i$ by rounding a quotient of $X_i$ divided by V to an integer, and obtaining $IY_i$ by rounding a quotient of $Y_i$ divided by V to an integer;

the setting a difference between values obtained by converting the coordinate values of the coordinate point of the spatial data into integers and values obtained by converting the coordinate values of the reference point P into integers, as compressed data, comprising setting a difference between values $IX_i$ and $IY_i$ obtained by converting the coordinate values of the coordinate point $P_i(X_i,Y_i)$ of the spatial data into integers and values RX and RY obtained by converting the coordinate values $X_r$ and $Y_r$ of the reference point $P(X_r,Y_r)$ into integers as the compressed data $DP(DX_i,DY_i)$ of the spatial coordinate point $P_i(X_i,Y_i)$, wherein $DX_i=IX_i-RX$;
$DY_i=IY_i-RY$.

11. The method according to claim 6, wherein converting the coordinate values of coordinate points of the spatial data and coordinate values $X_r$ and $Y_r$ of the reference point $P(X_r,Y_r)$ into integers according to the compression parameter Z comprises:

1) calculating a coordinate conversion parameter V according to the compression parameter Z calculated from the enlarging ratio R, wherein the V equals to 10 raised to a power of Z, i.e., $V=10^Z$;

2) converting coordinate values $X_r$ and $Y_r$ of the reference point $P(X_r,Y_r)$ into integers RX and RY according to the coordinate conversion parameter V, in a case that R is greater than or equal to 1, obtaining RX by rounding a product of $X_r$ multiplied by V to an integer, and obtaining RY by rounding a product of $Y_r$ multiplied by V to an integer; and in a case that R is less than 1, obtaining RX by rounding a quotient of $X_r$ divided by V to an integer, and obtaining RY by rounding a quotient of $Y_r$ divided by V to an integer;

3) setting an original coordinate point to be compressed in the spatial data as a coordinate point to be processed $P_i(X_i,Y_i)$, and converting coordinate values of the coordinate point to be processed $P_i(X_i,Y_i)$ into integers $IX_i$ and $IY_i$, in a case that R is greater than or equal to 1, obtaining $IX_i$ by rounding a product of $X_i$ multiplied by V to an integer part, and obtaining $IY_i$ by rounding a product of $Y_i$ multiplied by V to an integer; and in a case that R is less than 1, obtaining $IX_i$ by rounding a quotient of $X_i$ divided by V to an integer, and obtaining $IY_i$ by rounding a quotient of $Y_i$ divided by V to an integer;

the setting a difference between values obtained by converting the coordinate values of the coordinate point of the spatial data into integers and values obtained by converting the coordinate values of the reference point P into integers, as compressed data, comprising setting a difference between values $IX_i$ and $IY_i$ obtained by converting the coordinate values of the coordinate point $P_i(X_i,Y_i)$ of the spatial data into integers and values RX and RY obtained by converting the coordinate values $X_r$ and $Y_r$ of the reference point $P(X_r,Y_r)$ into integers as the compressed data $DP(DX_i,DY_i)$ of the spatial coordinate point $P_i(X_i,Y_i)$, wherein $DX_i=IX_i-RX$;
$DY_i=IY_i-RY$.

12. The method according to claim 6, further comprising:

acquiring, by the processor, a compression parameter Z and a reference point P according to a preset view control parameter, wherein the reference point P is the same as a the reference point configured to compress the spatial data;

converting, by the processor, coordinate values of the reference point P into integers according to the compression parameter Z in a same way as a compression of the spatial data; and calculating, by the processor, a sum of data values of coordinate points of compressed spatial data and values obtained by converting the coordinate values of the reference point P into integers, and calculating values of coordinate points of the spatial data from the sum according to the compression parameter Z in an inverse way of the compression of the spatial data to finish decompression of the spatial data.

13. The method according to claim 6, further comprising:

determining, by the processor, data bits n for storing each coordinate value of compressed spatial data according to a greater one of a width and a height of a view window in a preset view control parameter.

14. The method according to claim 1, wherein the determining, by the processor, a reference point P according to the rectangle range of spatial data displayed in the view window comprises:

determining the reference point P according to the rectangle range of the spatial data displayed in the view window, wherein the rectangle range is comprised in the view control parameter, and a central point of the rectangle range, any one vertex of the rectangle range, another point in the rectangle range or a point closest to the compressed point is set as the reference point P.

15. The method according to claim 14, wherein converting the coordinate values of coordinate points of the spatial data and coordinate values $X_r$ and $Y_r$ of the reference point $P(X_r,Y_r)$ into integers according to the compression parameter Z comprises:

1) calculating a coordinate conversion parameter V according to the compression parameter Z calculated from the enlarging ratio R, wherein the V equals to 10 raised to a power of Z, i.e., $V=10^Z$;

2) converting coordinate values $X_r$ and $Y_r$ of the reference point $P(X_r,Y_r)$ into integers RX and RY according to the coordinate conversion parameter V, in a case that R is greater than or equal to 1, obtaining RX by rounding a product of $X_r$ multiplied by V to an integer, and obtaining RY by rounding a product of $Y_r$ multiplied by V to an integer; and in a case that R is less than 1, obtaining RX by rounding a quotient of $X_r$ divided by V to an integer, and obtaining RY by rounding a quotient of $Y_r$ divided by V to an integer;

3) setting an original coordinate point to be compressed in the spatial data as a coordinate point to be processed $P_i(X_i,Y_i)$, and converting coordinate values of the coordinate point to be processed $P_i(X_i,Y_i)$ into integers $IX_i$ and $IY_i$, in a case that R is greater than or equal to 1, obtaining $IX_i$ by rounding a product of $X_i$ multiplied by V to an integer part, and obtaining $IY_i$ by rounding a product of $Y_i$ multiplied by V to an integer; and in a case that R is less than 1, obtaining $IX_i$ by rounding a quotient of $X_i$ divided by V to an integer, and obtaining $IY_i$ by rounding a quotient of $Y_i$ divided by V to an integer;

the setting a difference between values obtained by converting the coordinate values of the coordinate point of the spatial data into integers and values obtained by converting the coordinate values of the reference point P into integers, as compressed data, comprising setting a difference between values $IX_i$ and $IY_i$ obtained by converting the coordinate values of the coordinate point $P_i(X_i,Y_i)$ of the spatial data into integers and values RX and RY obtained by converting the coordinate values $X_r$ and $Y_r$ of the reference point $P(X_r,Y_r)$ into integers as the compressed data $DP(DX_i,DY_i)$ of the spatial coordinate point $P_i(X_i,Y_i)$, wherein $DX_i=IX_i-RX$;

$DY_i=IY_i-RY$.

16. The method according to claim 1, further comprising:

acquiring, by a processor, a compression parameter Z and a reference point P according to a preset view control parameter, wherein the reference point P is the same as a the reference point configured to compress the spatial data;

converting, by the processor, coordinate values of the reference point P into integers according to the compression parameter Z in a same way as a compression of the spatial data; and calculating, by the processor, a sum of data values of coordinate points of compressed spatial data and values obtained by converting the coordinate values of the reference point P into integers, and calculating values of coordinate points of the spatial data from the sum according to the compression parameter Z in an inverse way of the compression of the spatial data to finish decompression of the spatial data.

17. The method according to claim 1, further comprising:

determining, by the processor, data bits n for storing each coordinate value of the compressed spatial data according to a greater one of a width and a height of a view window in a preset view control parameter.

18. The method according to claim 17, wherein the determining data bits n for storing each coordinate value of compressed spatial data according to a greater one of a width and a height of a view window in a preset view control parameter, comprising:

determining the greater one of the width and the height of the view window in the view control parameter, calculating a product of the greater one multiplied by 10, setting the product as M, wherein M=max(W,H)*10; or setting the greater one of the width and the height of the view window in the view control parameter as M, wherein M=max(W,H), and wherein max indicates rounding to the maximum, W indicates the width of the view window, and H indicates the height of the view window; and setting data bits for storing M in a computer as the data bits n for storing each coordinate value of compressed spatial data.

19. A device for compressing spatial data, comprising: a processor and a memory storing program codes, wherein the processor performs the stored program codes to acquire a compression parameter Z according to a preset view control parameter, wherein the preset view control parameter comprises a width and a height of a view window for displaying the spatial data and a rectangle range of spatial data displayed in the view window;

determine a reference point P according to the rectangle range of spatial data displayed in the view window;

convert coordinate values of coordinate points of the spatial data and coordinate values of the reference point P into integers according to the compression parameter Z; and set a difference between values obtained by converting the coordinate values of the coordinate point of the spatial data into integers and values obtained by converting the coordinate values of the reference point P into integers, as compressed data.

* * * * *